United States Patent [19]
Lee et al.

[11] Patent Number: 6,159,833
[45] Date of Patent: Dec. 12, 2000

[54] METHOD OF FORMING A CONTACT HOLE IN A SEMICONDUCTOR WAFER

[75] Inventors: Chin-Hui Lee, Taipei; Chien-Hua Tsai, Tai-Chung; Chih-Cheng Liu, Pan-Chiao, all of Taiwan

[73] Assignee: United Microelectronics Corp., Hsin-Chu, Taiwan

[21] Appl. No.: 09/391,322

[22] Filed: Sep. 8, 1999

[51] Int. Cl.[7] ................ H01L 21/3205; H01L 21/4763
[52] U.S. Cl. .............. 438/585; 438/666; 438/701; 438/723; 438/906; 438/725
[58] Field of Search .................... 438/666, 701, 438/723, 906, 725, 700

[56] References Cited

U.S. PATENT DOCUMENTS

| | | |
|---|---|---|
| 5,201,993 | 4/1993 | Langley . |
| 5,468,342 | 11/1995 | Nulty et al. . |
| 5,563,098 | 10/1996 | Kuo et al. . |
| 5,817,579 | 10/1998 | Ko et al. . |
| 5,872,061 | 10/1997 | Lee et al. . |
| 5,880,019 | 4/1997 | Hsieh et al. . |
| 5,888,309 | 12/1997 | Yu . |
| 6,019,906 | 5/1998 | Jang et al. . |
| 6,025,273 | 4/1998 | Chen et al. . |

*Primary Examiner*—John F. Niebling
*Assistant Examiner*—Jonathan Hack
*Attorney, Agent, or Firm*—Winston Hsu

[57] ABSTRACT

The present invention provides a method of forming a contact hole in a semiconductor wafer. The semiconductor wafer comprises a silicon substrate, a silicon—oxygen layer positioned on the silicon substrate, and a photoresist layer positioned on the silicon—oxygen layer. An anisotropic dry-etching process is performed to vertically remove the silicon—oxygen layer below the opening to a predetermined depth to form the contact hole which contains a polymer layer on its surface. A soft-etching process is performed to remove the polymer layer in the contact hole. The dry-etching process and soft-etching process are performed alternatively to vertically remove the silicon—oxygen layer under the contact hole until the surface of the silicon substrate can be reached through the contact hole.

9 Claims, 3 Drawing Sheets

METHOD OF FORMING A CONTACT HOLE IN A SEMICONDUCTOR WAFER

BACKGROUND OF THE INVENTION

1. Field of the Invention

The present invention relates to a method of forming a contact hole in a semiconductor wafer, and more particularly, to a method of forming a contact hole in which the stability of the contact resistance can be enhanced.

2. Description of the Prior Art

In semiconductor processing, a contact hole can be used to form a metal interconnect between devices in the integrated circuit. The contact hole is made by performing a dry-etching process to form a hole on the surface of the wafer. In the prior art method of forming a contact hole, a high etching rate (OX/SiN>15) is applied to proceed a self-aligned contact etching. However, during the etching of the contact hole, polymers are produced and accumulated inside the contact hole, and the higher the etching rate, the more the polymers are produced. When forming a small size contact hole, polymers may be over-accumulated which results in stopping the etch process automatically, or known as "etch stop". Therefore, how to avoid polymers being over-accumulated during the etching process has become a very important issue.

Please refer to FIG. 1 and FIG. 2. FIG. 1 and FIG. 2 are schematic diagrams of the prior art method of forming a contact hole 20 in a semiconductor wafer 10. The semiconductor wafer 10 comprises a silicon substrate 12, a silicon—oxygen layer 14 positioned on the silicon substrate 12, and a photoresist layer 16 positioned on the silicon—oxygen layer 14 which comprises at least one opening 17 extending down to the silicon—oxygen layer 14. The silicon substrate 12 comprises two gate conductive layers 22 with rectangular cross section positioned on the silicon substrate 12, two gate oxide layers 24 positioned between the two gate conductive layers 22 and silicon substrate 12 respectively, two gate cap layers 26 positioned on the two gate conductive layers 22 respectively, and four spacers 28 positioned on the four vertical side walls of the two gate conductive layers 22 respectively. The two adjacent spacers 28 and the surface of the silicon substrate 12 form a groove 27. The opening 17 in the photoresist layer 16 is approximately Positioned above the groove 27.

The method of forming a contact hole of the prior art is performing an anisotropic dry-etching process to vertically remove the silicon—oxygen layer 14 below the opening 17 in the photoresist layer 16. However, there are polymers 29 produced and accumulated during the etching process. The accumulation of the polymers will obstruct the etching process and eventually stop the etching process. Thus, the prior art method can not form the contact hole 20 which extends down to the silicon substrate 12. As a result, contact open may occur and the stability of the contact resistance may be reduced.

SUMMARY OF THE INVENTION

It is therefore a primary objective of the present invention to provide a method of forming a contact hole in a semiconductor wafer to prevent from etching stop and to solve the above mentioned problem.

In a preferred embodiment, the present invention provides a method of forming a contact hole in a semiconductor wafer comprising a silicon substrate, a silicon—oxygen layer positioned on the silicon substrate, and a photoresist layer positioned on the silicon—oxygen layer which comprises at least one opening extending down to the silicon—oxygen layer; the method comprising:

performing an anisotropic dry-etching process to vertically remove the silicon—oxygen layer below the opening to a predetermined depth to form the contact hole which contains a polymer layer on its surface;

performing a soft-etching process to remove the polymer layer in the contact hole; and performing the dry-etching process and soft-etching process alternatively to vertically remove the silicon—oxygen layer under the contact hole until the surface of the silicon substrate can be reached through the contact hole.

It is an advantage of the present invention that the method can prevent the occurrence of contact open and enhance the stability of the contact resistance.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
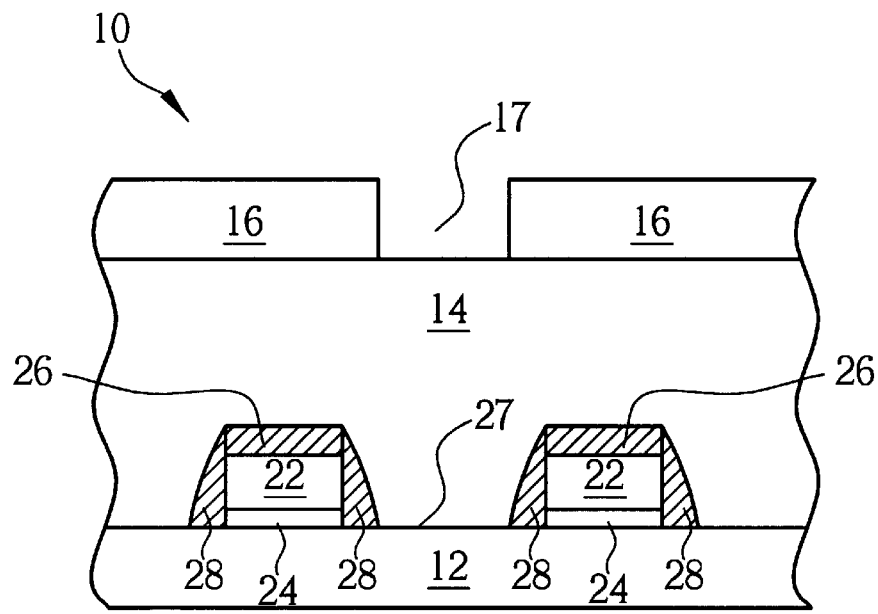
FIG. 1 and FIG. 2 are schematic diagrams of a method of forming a contact hole in a semiconductor wafer according to the prior art.
Figure 2:
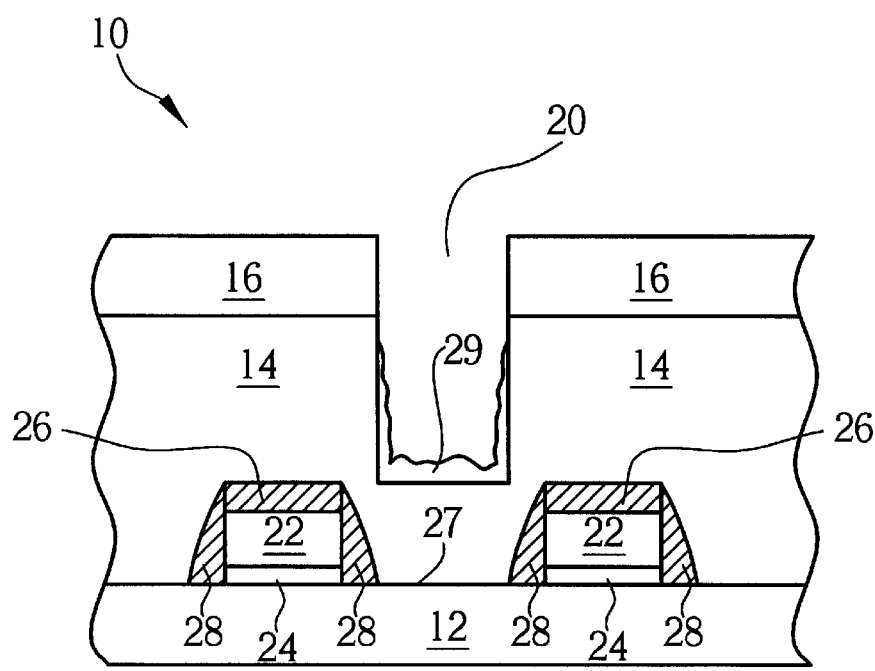
Figure 3:
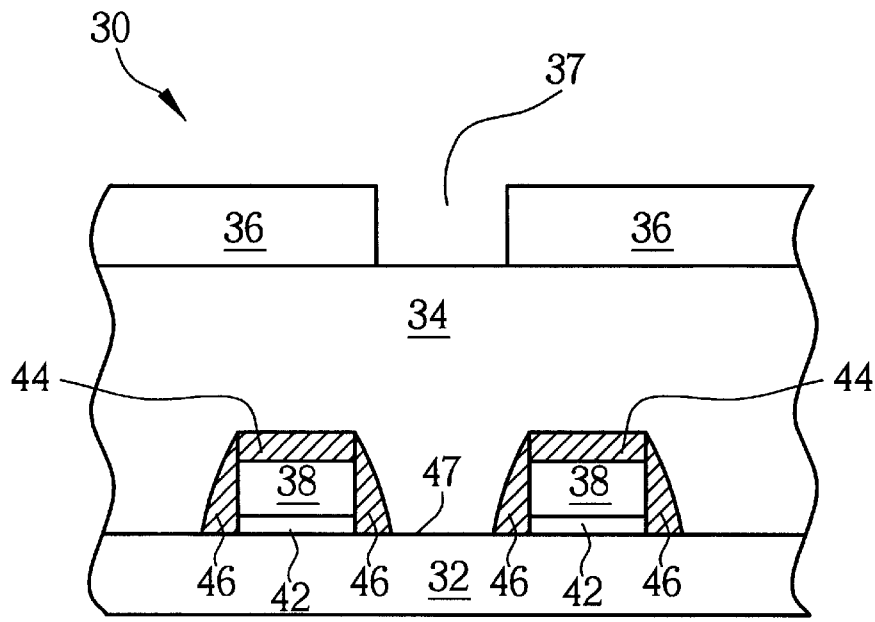
FIG. 3 is a sectional diagram of a semiconductor wafer for forming a contact hole according to the present invention.

Please refer to FIG. 3. FIG. 3 is a sectional diagram of a semiconductor wafer 30 for forming a contact hole according to the present invention. The present invention is a method of forming a contact hole in a semiconductor wafer 30. The semiconductor wafer 30 comprises a silicon substrate 32, a silicon—oxygen layer 34 positioned on the silicon substrate 32, and a photoresist layer 36 positioned on the silicon—oxygen layer 34 which comprises at least one opening 37 extending down to the silicon—oxygen layer 34. The semiconductor wafer 30 further comprises two gate conductive layers 38 with rectangular cross section positioned on the silicon substrate 32, two gate oxide layers 42 positioned under the two gate conductive layers 38 respectively, two gate cap layers 44 positioned on the two gate conductive layers 38 respectively, and four spacers 46.

Two gate conductive layers 38 comprise four vertical side walls. Four spacers 46 are positioned on the four vertical side walls of the two gate conductive layers 38 respectively. The two adjacent spacers 46 of the two gate conductive layers 38 and the surface of the silicon substrate 32 form a groove 47. The opening 37 of the photoresist layer 36 is approximately positioned on the groove 47. The two gate cap layers 44 on the two gate conductive layers 38 and the four spacers 46 on the vertical side walls of the two gate conductive layers 38 are formed of silicon nitride, oxynitride or silicon rich oxide (SRO).

Figure 4:
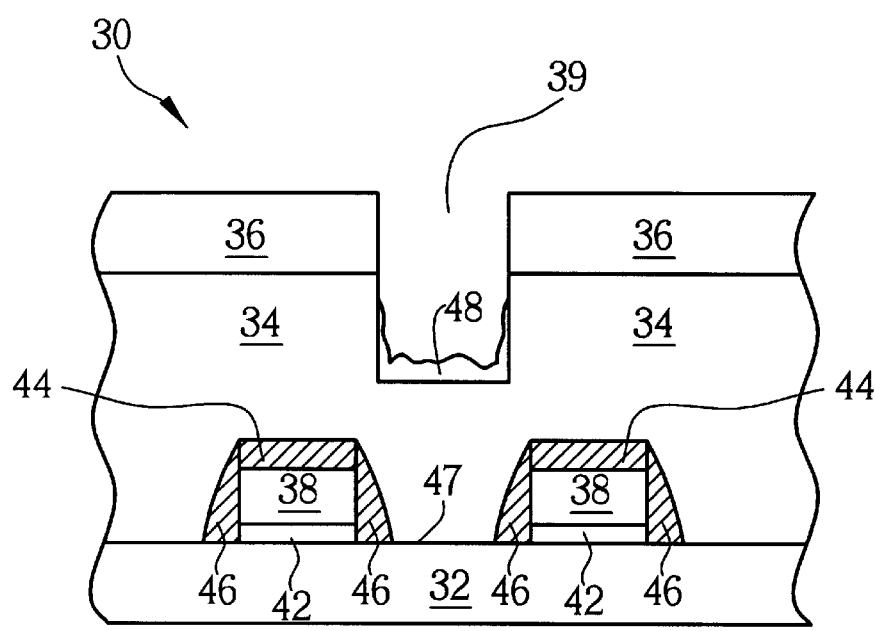
FIG. 4 to FIG. 6 are schematic diagrams of the method of forming the contact hole according to the present invention.
Figure 5:
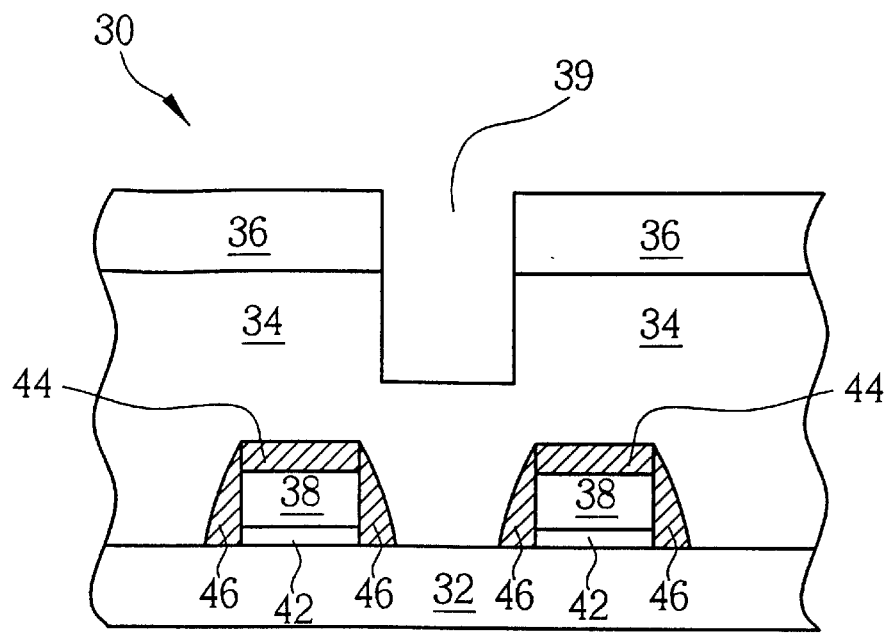
Figure 6:
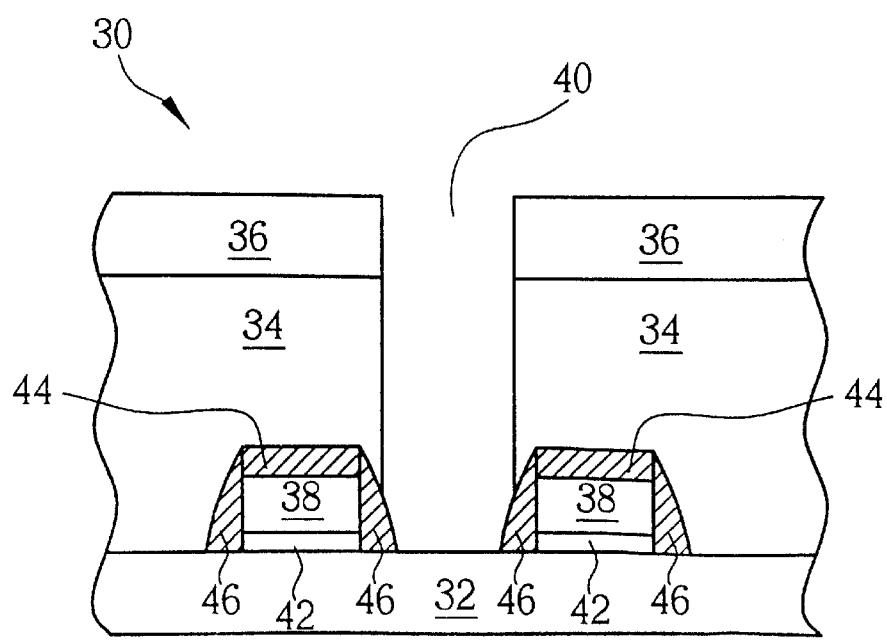

Please refer to FIG. 4 to FIG. 6. FIG. 4 to FIG. 6 are schematic diagrams of the method of forming the contact hole 40 according to the present invention. In the method of forming the contact hole 40 according to the present invention, an anisotropic dry-etching process is performed to vertically remove the silicon—oxygen layer 34 below the opening 37 to a predetermined depth to approximately form a contact hole 39. Because polymers are produced during the etching process, the contact hole 39 contains a polymer layer 48 on the surface of the contact hole 39, as shown in FIG. 4. Next, a soft-etching process is performed and which employs oxygen and argon as reactive gases for removing the polymer layer 48 from the surface of the contact hole 39, as shown in FIG. 5. Next, the dry-etching process and the soft-etching process are alternatively performed to vertically remove the silicon—oxygen layer 34 under the contact hole 39 until the surface of the silicon substrate 32 can be reached through the contact hole 40, as shown in FIG. 6.

In the present invention, the dry-etching process and the soft-etching process are both performed in a vacuum chamber of an etching machine. During the soft-etching process, the pressure of the vacuum chamber is maintained at 30 to 60 mTorr, the etching power of the vacuum chamber is maintained at 300 to 600 watts, the flow rate of the oxygen gas injected into the vacuum chamber is controlled at 10 to 40 sccm, and the flow rate of the argon gas injected into the vacuum chamber is controlled at 50 to 200 sccm.

Using an electrical microscope to observe the contact hole 40 formed by the method of the present invention, it was found that the surface of the silicon substrate 32 could be reached through the contact hole 40. In the present invention, "etch stop" will not occur during the formation of the contact hole 40, because the dry-etching process and the soft-etching process are alternatively performed wherein the polymer layer 48 formed during the etching process can be removed by using the soft-etching process. The number for repeating the soft-etching process to remove the polymer layer 48 on the surface of the contact hole 39 can be determined by the size and depth of the contact hole 40. Since the polymer layer 48 can be removed effectively, etch stop to form an incomplete contact hole will not occur. Even though the size of the contact hole 40 is reduced, a contact hole which meets the requirement can still be formed by using the method of the present invention. The method of the present invention can prevent the occurrence of contact open and enhance the stability of the contact resistance.

In contrast to the prior art method of forming the contact hole 20, the method of forming the contact hole 40 according to the present invention employs a dry-etching process to vertically remove the silicon—oxygen layer to a predetermined depth, then a soft-etching process to remove the polymer layer in the contact hole, and than the dry-etching process to continue forming the contact hole. The dry-etching process and the soft-etching process are alternatively performed until the surface of the substrate can be reached through the contact hole. Therefore, "etch stop" to form an incomplete contact hole caused by the accumulation of the polymer layer will not occur, and hence the stability of the contact resistance can be enhanced.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a contact hole in a semiconductor wafer, the semiconductor wafer comprising a silicon substrate, a silicon—oxygen layer positioned on the silicon substrate, and a photoresist layer positioned on the silicon—oxygen layer which comprises at least one opening extending down to the silicon—oxygen layer; the method comprising:

performing an anisotropic dry-etching process to vertically remove the silicon—oxygen layer below the opening to a predetermined depth to form the contact hole which contains a polymer layer on its surface;

performing a soft-etching process to remove the polymer layer in the contact hole; and performing the dry-etching process and soft-etching process alternatively to vertically remove the silicon—oxygen layer under the contact hole until the surface of the silicon substrate can be reached through the contact hole.

2. The method of claim 1 wherein the dry-etching process and the soft-etching process are both performed in a vacuum chamber of an etching machine.

3. The method of claim 1 wherein the silicon substrate comprises:

two gate conductive layers with rectangular cross section positioned on the silicon substrate, the two gate conductive layers comprising four vertical side walls;

two gate oxide layers positioned under the two gate conductive layers respectively;

two gate cap layers positioned on the two gate conductive layers respectively; and four spacers positioned on the four vertical side walls of the two gate conductive layers respectively;

wherein the two adjacent spacers of the two gate conductive layers and the surface of the silicon substrate form a groove, and the opening in the photoresist layer is approximately positioned on the groove.

4. The method of claim 3 wherein the gate cap layer and the four spacers are formed of silicon nitride oxy-nitride or silicon rich oxide (SRO).

5. The method of claim 1 wherein the soft-etching process is performed in a vacuum chamber which employs oxygen and argon as reactive gases for removing the polymer layer.

6. The method of claim 5 wherein the pressure of the vacuum chamber is maintained at 30 to 60 mTorr during the soft-etching process.

7. The method of claim 5 wherein the etching power of the vacuum chamber is maintained at 300 to 600 watts during the soft-etching process.

8. The method of claim 5 wherein the flow rate of the oxygen gas injected into the vacuum chamber is controlled at 10 to 40 sccm during the soft-etching process.

9. The method of claim 1 wherein the flow rate of the argon gas injected into the vacuum chamber is controlled at 50 to 200 sccm during the soft-etching process.

* * * * *